(12) United States Patent
Zehr et al.

(10) Patent No.: US 9,053,710 B1
(45) Date of Patent: Jun. 9, 2015

(54) AUDIO CONTENT PRESENTATION USING A PRESENTATION PROFILE IN A CONTENT HEADER

(75) Inventors: Gregg Elliott Zehr, Palo Alto, CA (US); Tina Yung-Ting Chen, San Jose, CA (US); Tony David, San Jose, CA (US); Timothy T. List, Santa Cruz, CA (US)

(73) Assignee: Amazon Technologies, Inc., Reno, NV (US)

( * ) Notice: Subject to any disclaimer, the term of this patent is extended or adjusted under 35 U.S.C. 154(b) by 243 days.

(21) Appl. No.: 13/608,936

(22) Filed: Sep. 10, 2012

(51) Int. Cl.
*G10L 21/034* (2013.01)
*G10L 15/20* (2006.01)
*H03G 3/20* (2006.01)
*H03G 3/32* (2006.01)

(52) U.S. Cl.
CPC ............... *G10L 21/034* (2013.01); *H03G 3/20* (2013.01)

(58) Field of Classification Search
CPC ........ G10L 15/20; G10L 21/034; H03G 3/20; H03G 3/32
USPC ............ 704/224, 225, 226, 278, 233; 381/57, 381/60, 94.1, 94.2, 103, 104, 109, 107
See application file for complete search history.

(56) References Cited

U.S. PATENT DOCUMENTS

| | | | |
|---|---|---|---|
| 7,110,558 B1 * | 9/2006 | Elliott | 381/105 |
| 7,181,021 B2 * | 2/2007 | Raptopoulos et al. | 381/103 |
| 7,181,297 B1 * | 2/2007 | Pluvinage et al. | 381/60 |
| 7,398,207 B2 * | 7/2008 | Riedl | 704/225 |
| 7,774,078 B2 * | 8/2010 | Booth et al. | 381/103 |
| 8,284,955 B2 * | 10/2012 | Bonglovi et al. | 381/98 |
| 8,379,880 B2 * | 2/2013 | Riedl | 381/107 |
| 2004/0044525 A1 * | 3/2004 | Vinton et al. | 704/224 |
| 2004/0131206 A1 * | 7/2004 | Cao et al. | 381/103 |
| 2004/0177122 A1 * | 9/2004 | Appelman et al. | 709/206 |
| 2005/0078840 A1 * | 4/2005 | Riedl | 381/104 |
| 2006/0045281 A1 * | 3/2006 | Korneluk et al. | 381/60 |
| 2006/0116175 A1 * | 6/2006 | Chu | 455/567 |
| 2007/0038442 A1 * | 2/2007 | Visser et al. | 704/233 |
| 2008/0165980 A1 * | 7/2008 | Pavlovic et al. | 381/60 |
| 2009/0016540 A1 * | 1/2009 | Heningsen Nielsen et al. | 381/56 |
| 2009/0046873 A1 * | 2/2009 | Riedl | 381/107 |
| 2009/0097664 A1 * | 4/2009 | Archibald | 381/56 |
| 2009/0123004 A1 * | 5/2009 | Otto et al. | 381/104 |
| 2010/0158275 A1 * | 6/2010 | Zhang et al. | 381/107 |
| 2010/0232626 A1 * | 9/2010 | Paquier et al. | 381/119 |
| 2010/0239110 A1 * | 9/2010 | Lasch et al. | 381/307 |

* cited by examiner

*Primary Examiner* — Martin Lerner

(74) *Attorney, Agent, or Firm* — Sutherland Asbill & Brennan LLP

(57) ABSTRACT

Described are systems and methods for content-adaptive presentation of content. A presentation profile for use in presentation of content is determined based at least in part on one or more determination characteristics. The determination characteristics may include metadata descriptive of the content, such as genre, style, artist, and so forth. The presentation profile may include equalizer settings, overall amplitude or volume, speaker configuration, and so forth.

12 Claims, 11 Drawing Sheets

AUDIO CONTENT PRESENTATION USING A PRESENTATION PROFILE IN A CONTENT HEADER

BACKGROUND

Users may consume audible content ranging from audiobooks, lectures, music, movies, and so forth. Various settings may be adjusted by the user to affect the presentation. However, these settings may be cumbersome to change, resulting in a user experience which draws the user's attention from the content to the configuration.

Figure 1:
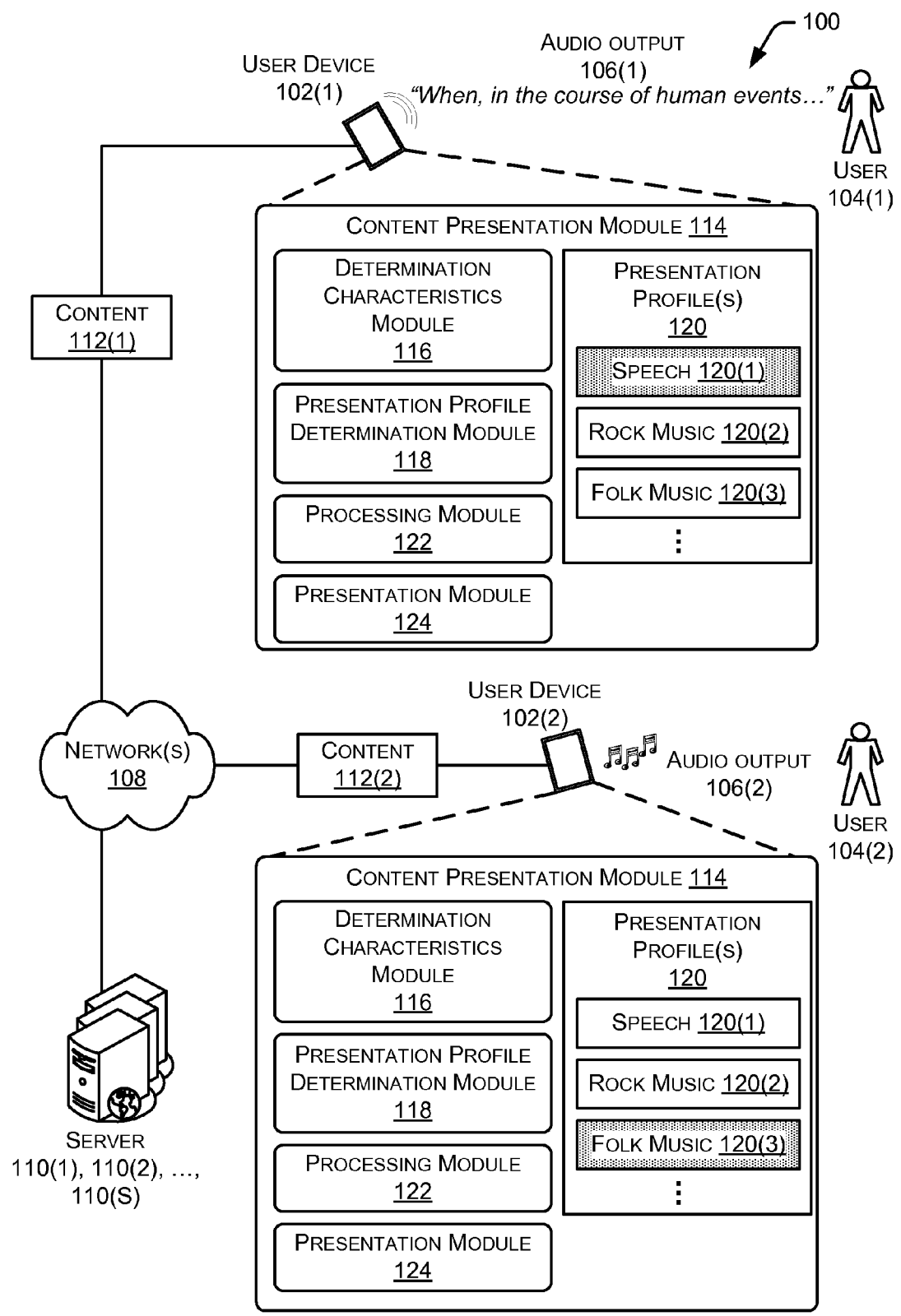
FIG. 1 illustrates a system for content-adaptive determination of presentation profiles for presenting content.

Certain implementations will now be described in detail below with reference to the accompanying drawings, in which various implementations and/or aspects are shown. However, various aspects may be implemented in many different forms and should not be construed as limited to the implementations set forth herein. Like numbers refer to like elements throughout.

DETAILED DESCRIPTION

A wide variety of audio content ranging from audiobooks, lectures, music, broadcasts, movies, and so forth are available. Users may access or otherwise consume this content with user devices such as portable media players, smartphones, laptop computers, desktop computers, tablet computers, televisions, set-top boxes, game consoles, in-vehicle computer systems, and so forth.

These user devices may provide the capability to process or modify audio. This processing may range from treble and bass controls to parametric audio equalizers and so forth. Traditionally this processing is used to adjust the audio output to suit the user. For example, the user may amplify bass frequencies for music playback. However, the wide variety of content may result in user readjusting the processing as different content is consumed. Continuing the example, when listening to an audio book the user may adjust the controls to attenuate bass and amplify treble to improve their listening experience. As the user consumes different pieces of content, ongoing intervention is called for to keep adjusting the processing settings. This ongoing intervention detracts from the user experience, causing the user to focus on the mechanics of presentation of the content rather than the content itself.

This disclosure describes systems and methods for content-adaptive presentation profiles. A content presentation module is described which determines a presentation profile to use for processing the audio for presentation based on the content being presented. A presentation profile describes a pre-determined group of settings for use in processing the audio for presentation. For example, a presentation profile may provide for a pre-determined set of parametric audio equalizer settings and speaker configurations.

The content presentation module may determine the content and an associated presentation profile based on one or more determination characteristics. These determination characteristics may include one or more of a content header, content metadata, frequency data, amplitude, and so forth. For example, where the content metadata indicates the content is an audiobook, the content presentation module may determine and use for presentation a speech presentation profile configured to improve intelligibility. In comparison, when the user proceeds to listen to folk music, a different presentation profile associated with folk music is determined and used. As a result, the user is able to enjoy presentation which adapts automatically based on the type of content being presented.

The content presentation module may also be configured to adjust or change the presentation profile being used to facilitate understanding of human speech by another user or a machine. For example, during presentation of content, a user may issue spoken commands to the user device. Instead of ceasing presentation of the content while the user is speaking, the content presentation module may be configured to present the content with a presentation profile tailored to improve speech recognition. This tailoring may be configured to attenuate or suppress in the presented content frequencies of particular significance to the speech recognition. As a result, overall accuracy of the speech recognition is improved while maintaining the user experience.

Illustrative System

FIG. 1 illustrates a system 100 for content-adaptive determination of presentation profiles for presenting content. One or more user devices 102(1), 102(2), . . . 102(D) may be used by one or more users 104(1), 104(2), . . . 104(U). As used herein, letters enclosed by parenthesis such as "(D)" or "(U)" indicate an integer having a value greater than zero. The user devices 102 may include portable media players, smartphones, laptop computers, desktop computers, tablet computers, televisions, set-top boxes, game consoles, in-vehicle computer systems, and so forth. The user devices 102 are configured to provide audio output 106. The audio output 106 may be generated by an audio output device such as a speaker, piezoelectric transducer, and so forth. The user device 102 is described below in more detail with regard to FIG. 2.

The user device 102 may be configured to couple via a communication interface to one or more networks 108. The network 108 may comprise one or more private networks, public networks such as the Internet, or a combination of both, configured to transfer data between two or more devices One or more servers 110 are coupled to the network 108. The server 110 may be configured to provide various services such as delivering content 112 and so forth. While the content 112 is depicted as being delivered to the user device 102 via the network 108, in other implementations the content 112 may be delivered by physical media such as compact disks, digital versatile disks, flash memory, magnetic memory, and so forth.

The server 110 may comprise one or more processors, memory, network interfaces, and so forth similar to those described below with regard to the user device 102. Functions associated with the server 110 are discussed in more detail below.

The content 112 may comprise audio files, video files, musical instrument digital interface ("MIDI") files, and so forth. The content 112 may be provided to the user device 102 by streaming, file transfer, and so forth. In some implementations the content 112 may include content for presentation, content headers, content metadata, and so forth. For example, in some implementations the content 112(1) may be transferred to the user device 102(1) via the network 108 with content metadata indicating the genre of the content 112(1) is "audiobook."

The user device 102 comprises a content presentation module 114. The content presentation module 114 is configured to provide content-adaptive determination of presentation profiles for processing the content 112 and presenting as audio output 106. The content presentation module 114 may include a determination characteristics module 116 ("characteristics module"), a presentation profile determination module 118 ("profile module"), one or more presentation profiles 120, a processing module 122, and a presentation module 124.

The characteristics module 116 is configured to determine one or more determination characteristics associated with the content 112. The determination characteristics may be data in addition to the content 112, incorporated with the content 112, or inherent in the content. For example, a content header providing information such as a particular presentation profile 120 to be used may be appended to or associated with the content 112. Content metadata describing a genre and title may be incorporated or embedded within a portion of the content 112. In comparison, frequency, amplitude, particular spoken words, or other data may be inherent in the content 112. The characteristics module 116 determines and provides the determination characteristics to the profile module 118. The determination characteristics are discussed in more detail below with regard to FIG. 3.

The profile module 118 is configured to, based at least in part on one or more of the determination characteristics, determine a presentation profile 120 for use in processing the content 112 and presenting the audio output 106. For example, the characteristics module 116 may determine the content 112(1) is of the genre "audiobook." The profile module 118 may use a lookup table to associate the genre "audiobook" with a presentation profile tailored for speech 120(1). In this illustration, the presentation profile 120 selected for processing the content 112 for presentation is indicated with a shaded box. Other genres may be associated with other presentation profiles configured for the presentation of rock music 120(2), folk music 120(3), and so forth.

The profile module 118 may be configured to determine the presentation profiles prior to playback, at periodic intervals, at pre-determined events such scene changes, or continuously. For example, when the profile determination is occurring continuously, the presentation profile 120 in use for processing may dynamically shift during presentation. The profile module 118 provides the determined particular presentation profile 120 to the processing module 122.

The processing module 122 uses the determined presentation profile 120 to process the content 112 for presentation. Continuing the example, the processing module 122 may access the presentation profile for speech 120(1) which contains particular audio equalizer settings and volume settings and process the content 112(1) with these settings to generate processed content. The processed content may then be provided to the presentation module 124.

The presentation module 124 is configured to present or render the processed content as audio output 106. The presentation module 124 may be configured to interface with an audio interface device coupled to a speaker or other electroacoustic transducer.

The server 110 may comprise a content presentation module 114 or portions thereof. For example, the server 110 may include a characteristics module 116, profile module 118, one or more presentation profiles 120, and processing module 122. The presentation module 124 may be omitted, such as where the presentation module 124 of the user device 102 is used to present the content.

In some implementations the server 110 may provide the functions of the content presentation module 114 in place of, or in addition to, a content presentation module 114 on the user device. For example, the user 104 may use the user device 102 to select content for streaming from the server 110. The server 110 may determine the determination characteristics, determine a presentation profile, and provide content 112 which is processed to the user device 102. The user device 102 may then receive this stream of processed content and use the presentation module 124 to present the audio output 106.

Figure 2:
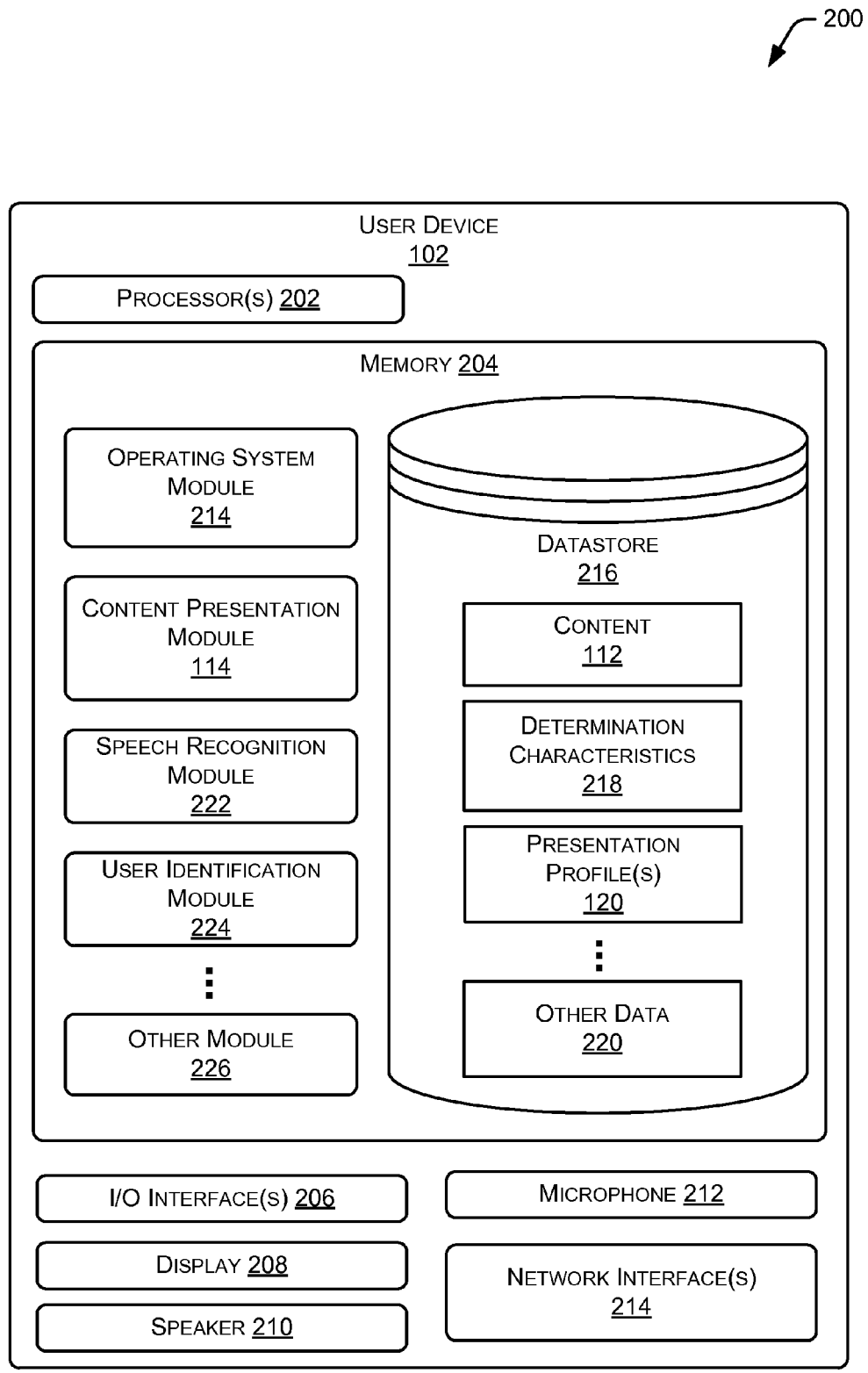
FIG. 2 illustrates a diagram of a user device configured to provide content-adaptive determination of presentation profiles.

FIG. 2 illustrates a diagram 200 of the user device 102 configured to provide content-adaptive determination of presentation profiles. The user device 102 may comprise one or more processors 202, one or more memories 204, one or more input/output ("I/O") interfaces 206, one or more displays 208, one or more speakers 210 or other electroacoustic transducers, one or more microphones 212, and one or more network interfaces 214.

The processor 202 may comprise one or more cores and is configured to access and execute at least in part instructions stored in the one or more memories 204. In some implementations the processor 202 may comprise a digital signal processor. The one or more memories 204 comprise one or more computer-readable storage media ("CRSM"). The one or more memories 204 may include, but are not limited to, random access memory ("RAM"), flash RAM, magnetic media, optical media, and so forth. The one or more memories 204 may be volatile in that information is retained while providing power or non-volatile in that information is retained without providing power.

The one or more I/O interfaces 206 allow for coupling devices, such as keyboards, external memories, displays, speakers, and so forth, to the user device 102. The I/O interfaces may include universal serial bus ("USB"), inter-integrated circuit ("I2C"), high definition multimedia interface ("HDMI"), ADAT Optical Interface, and so forth.

The display 208 is configured to present visual information to the user 104 and may be coupled to the I/O interfaces 206. The speaker 210 or other electroacoustic transducer is configured to generate audible sound. One or more microphones 212 or other transducers are configured to detect audible sound. The one or more network interfaces 214 provide for the transfer of data between the user device 102 and another device, such as the server 110 via the network 108. The network interfaces 214 may include, but are not limited to, wired local area networks ("LANs"), wireless local area networks ("WLANs"), wireless wide area networks ("WWANs"), and so forth.

The one or more memories 204 may store code or program instructions for execution by the processor 202 to perform certain actions or functions. These instructions may include an operating system module 214 configured to manage hardware resources such as the I/O interfaces 206 and provide various services to applications executing on the processor 202. The one or more memories 204 may also store a datastore 216 containing information about the operating system module 214, content 112 or portions thereof, presentation profile determination characteristics 218, presentation profiles 120, and other data 220. The presentation profile determination characteristics (or "determination characteristics") 218 are discussed below in more detail with regard to FIG. 3.

The one or more memories 204 may store the content presentation module 114 as described above with regard to FIG. 1. A speech recognition module 222 may be configured to accept audible input and generate recognized text. As described above, the content presentation module 114 may work in conjunction with the speech recognition module 222 to determine a presentation profile 120 which facilitates speech recognition.

A user identification module 224 may be configured to identify the user 104. The content presentation module 114 may use this identity to determine which presentation profile 120 to use for processing the content 112. For example, the identification may be used to select particular preferences of the user 104. The user 104 may be identified with a password, biometric indicators such as voice, fingerprint, face, and so forth. One or more biometric input devices may be used to acquire the biometric indicators. The biometric input devices may include cameras, fingerprint readers, palm scanners, microphones, and so forth. The user 104 may be identified by recognizing one or more biometric indicators and comparing those indicators to previously stored data.

Other modules 226 may also be stored. For example, a digital rights management module may be used to control access to the content 112. In another example, an encryption module may be present to provide for an encrypted connection with the server 110 over the network 108.

Figure 3:
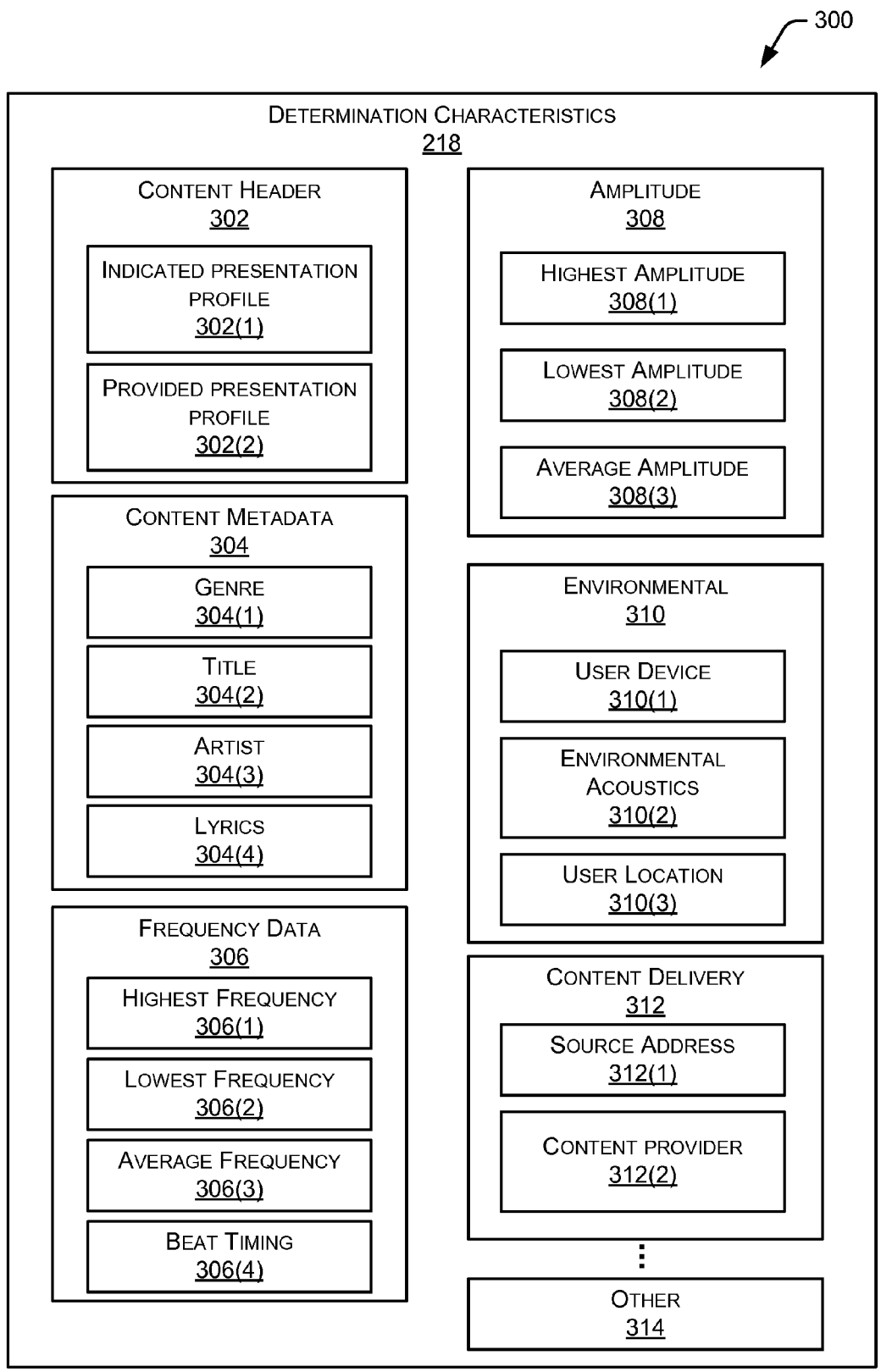
FIG. 3 illustrates a block diagram of determination characteristics which may be used to determine the presentation profile for use during presentation.

FIG. 3 illustrates a block diagram 300 of the determination characteristics 218 comprising data descriptive of the content 112 which may be used by the determination characteristics module 116 to determine the presentation profile 120 for use during presentation of the content 112. The determination characteristics 218 may be data in addition to the content 112 such as a content header 302, incorporated with the content 112 such as content metadata 304, inherent in the content such as frequency 306 or amplitude 308 data, or about the user device 102 used for presentation or the environment in which the user device is present. In other implementations the content header 302, the content metadata 304, or both may be separate from or incorporated into the content 112.

The content header 302 comprises data for use by the characteristics module 116 to explicitly specify a particular presentation profile for use. This may be a particular presentation profile designated by a user, or by previous processing of the determination module 118. This data may include an indicated presentation profile 302(1) or a provided presentation profile 302(2). The indicated presentation profile 302(1) provides a referent to a pre-determined presentation profile 120. For example, the indicated presentation profile 302(1) for the content 112(1) may be configured to designate that the presentation profile for speech 120(1) for use during presentation.

The content header 302 may comprise a file separate from, but associated with, the content 112. The user devices 102 which are not configured to process the content header 302 may ignore the content header 302 and still present the content to the user 104. However, for the user devices 102 which are configured to process the content header 302, the designated presentation profile 120 may be used. In another implementation, the indicated presentation profile 302(1) may be embedded within the content 112.

In comparison, the provided presentation profile 302(2) contains the data expressing the presentation profile 120. For example, the provided presentation profile 302(2) may comprise an extensible markup language ("XML") file which designates particular audio equalizer settings, speaker configuration, and so forth. For example, the server 110 may generate or distribute the provided presentation profile 302(2) with the content 112. Other content header information 302(H) may also be included, such as an indicator of the use of multiple presentation profiles 120 during presentation of the content 112.

The content metadata 304 provides information about the content 112, such as genre 304(1), title 304(2), artist 304(3), lyrics 304(4), and so forth. The characteristics module 116 may be configured to process the content metadata 304 and provide output to the profile module 118 for use in determining the presentation profile 120 for processing. For example, the content 112(2) may include content metadata 304 which indicates the content is a song in the genre 304(1) of folk music. Based at least in part on this genre 304(1), the profile module 118 determines the presentation profile for folk music 120(3) is appropriate for use. The processing module 122 may then process using this presentation profile 120(3) and the presentation module 124 provides the audio output 106(2) in which the content 112 is presented with settings to enhance the user experience.

In some implementations, the characteristics module 116 may use frequency data 306 to determine the presentation profile 120. For example, the content header 302 may be unavailable or the content metadata 304 may be incomplete or absent. The characteristics module 116 may be configured to analyze the data inherent in the content 112 to generate the frequency data 306. The frequency data 306 may include various metrics including, but not limited to, highest frequency 306(1), lowest frequency 306(2), average frequency 306(3), beat timing 306(4), and so forth. For example, the frequency data 306 may allow for distinction between audio content of an alto glockenspiel and a bass cello solo or a male voice or female voice. Based at least in part on the different frequency data 306, the profile module 118 may select different presentation profiles 120 configured to enhance the presentation of these different pieces of content.

The determination characteristics 218 may also include the amplitude 308 of the content 112. The amplitude 308 may be measured as a determined at particular sample points, averaged over a particular time interval, and so forth. The amplitude data 308 may include various metrics including, but not limited to, highest amplitude 308(1), lowest sustained amplitude 308(2), average amplitude 308(3), and so forth. For example, the frequency data 306 may allow for distinction between audio content of an alto glockenspiel and a bass cello solo or between a male voice and a female voice.

Environmental 310 characteristics may also be considered in the determination of the presentation profile 120. User device characteristics 310(1) such as make, model, speaker attributes, and so forth may be used. For example, the presentation profile 120 may vary based on whether the speakers are a particular size.

Environmental acoustics 310(2) may be accounted for in the determination. For example, a small room with hard surfaces and a noticeable echo may use a presentation profile 120 which differs from that used in a relatively anechoic space. In some implementations, the one or more of the microphones 212 may be used to determine the environmental acoustics 310(2). This may be passive, where the one or more microphones 212 listen to ambient noise, such as determining the noise from an air conditioner. Active determination of the environmental acoustics 310(2) may also be used. For example, the speakers 210 may be configured to emit known sound and the microphones 212 may be used to recover the sound and other data such as echoes, distortion, and so forth.

The environmental characteristics 310 may also include user location 310(3), that is, the location of the user 104 relative to the one or more of the speakers 210, the one or more microphones 212, or both. For example, the presentation profile 120 may be adjusted to provide audio imaging of the sound to the location of the user 104.

The determination characteristics 218 may also include information about content delivery 312 such as a source address 312(1), content provider 312(2) and so forth. The source address 312(1) may be used at least in part to determine the presentation profile 120. For example, the content 112 provided by the server 110 having an address associated with a content provider 312(2) of audio books may be determined to use the presentation profile for speech 120(1).

Other determination characteristics 314 may also be provided. For example, when the content 112 comprises video data, the other determination characteristics 314 may include closed captioning data associated with the audio. The profile module 118 may be configured to recognize the musical note or "(music)" tags or other text present in the captioning to determine the presentation profile 120 for use.

The profile module 118 may use several different determination characteristics 218 in sequence or together to determine the presentation profile 120. This allows for fine grained control and an improved user experience. For example, the content metadata 304 may indicate a genre 304(1) of "classical music" while the frequency data 306 and amplitude 308 may allow for selection of a "classical music—glockenspiel" specific presentation profile 120.

Figure 4:
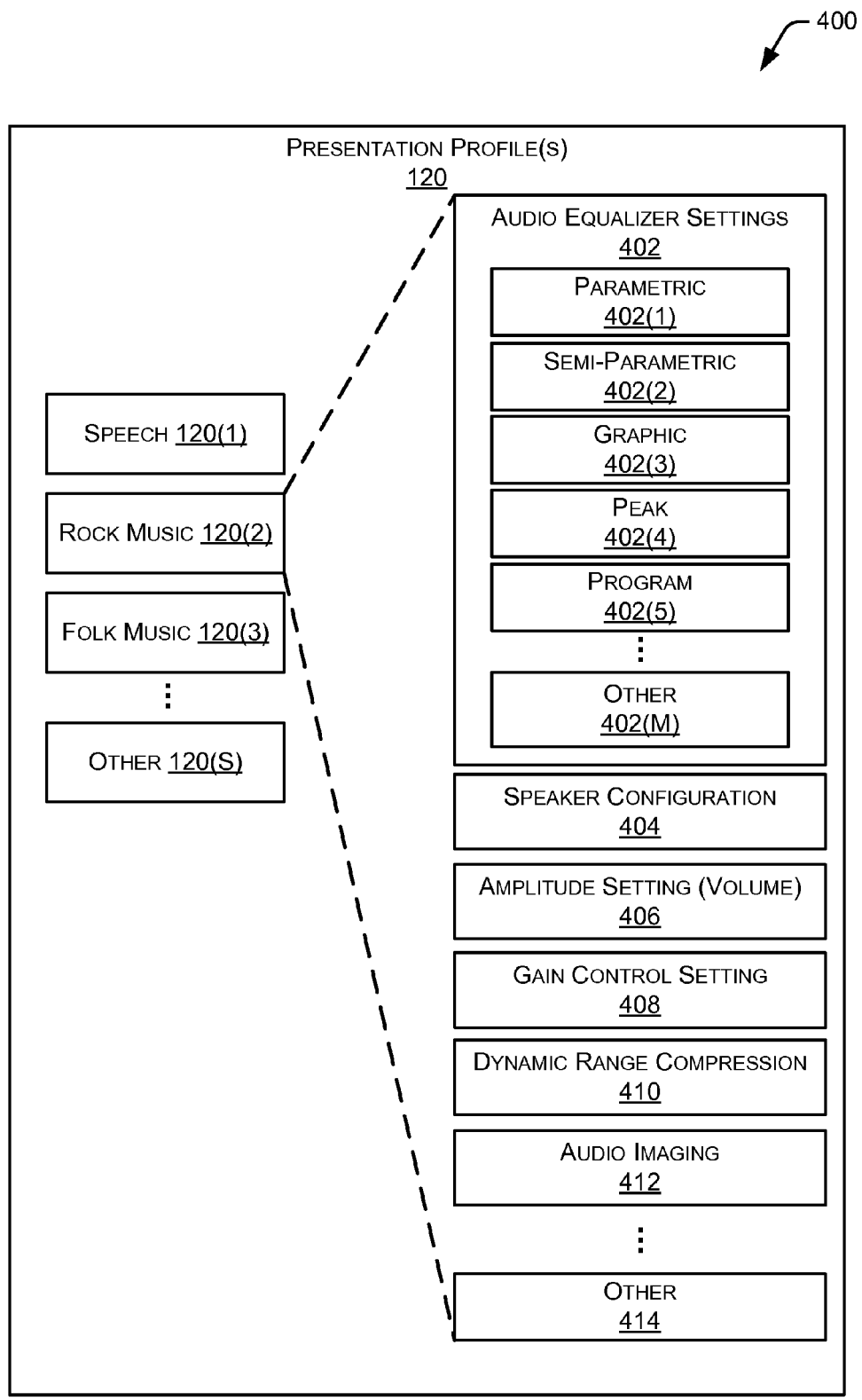
FIG. 4 illustrates a block diagram of presentation profiles and associated settings.

FIG. 4 illustrates a block diagram 400 of the presentation profiles 120 and associated settings. The presentation profiles 120 define how the content 112 is processed and rendered as audio output 106 by the user device 102. The presentation profiles 120 may be embodied as XML, flat, or other files. In some implementations the presentation profiles 120 may be embedded into the content 112.

Different presentation profiles 120 may be configured for use with different content 112. As shown here, the presentation profiles 120 may be configured for speech 120(1), rock music 120(2), folk music 120(3), and so forth. The determination of which presentation profile 120 to use may be granular and vary based on available data about the content 112 or other factors. For example, the presentation profile for speech 120(1) may be used initially. When additional information such as the frequency data 306 is available which indicates the speaker is female, a different presentation profile 120(4) may be selected for use instead. A presentation profile 120(5) may be provided for presenting machine generated speech, such as that generated by a speech synthesizer.

The presentation profile 120 may include one or more audio equalizer settings 402. As described in this disclosure, an equalizer processes audio to alter frequency response during presentation. The audio equalizer settings 402 are configured to set a device processing the audio for presentation to attenuate or amplify one or more audio frequency bands during presentation of the content. For example, the audio equalizer settings 402 may be configured to set a processor used to generate processed audio to apply the attenuation or amplification to the content. The audio equalizer settings 402 may include parametric 402(1), semi-parametric 402(2), graphic 402(3), peak 402(4), program 402(5), or other equalizer types 402(M). In some implementations, one or more different audio equalizer settings 402 may be used simultaneously.

The presentation profile 120 may include speaker configuration 404 data. The speaker configuration 404 may be configured to selectively direct audio output 106 to particular output devices. The speaker configuration 404 may comprise information configured to set an audio output device such as the user device to use a particular set of one or more speakers during presentation of the content. For example, the speaker configuration 404 may be configured to selectively increase volume to a first speaker while decreasing volume to a second speaker. In another example, the speaker configuration 404 may specify particular audio bands for presentation on particular speakers. For example, bass audio may be directed to a woofer.

An amplitude setting 406 or volume may be specified in the presentation profiles 120. For example, the amplitude setting 406 may indicate that the average amplitude over a pre-determined time interval should be a pre-determined value. The amplitude settings 406 are configured to set a processor which is processing the content to apply an overall attenuation or amplification to the content.

Gain control settings 408 may also be specified. The gain control settings 408 allow for dynamic adjustment of attenuation or amplification of the presented output by using feedback from the presentation of the content to adjust amplification or gain during presentation of the content. The gain control settings 408 are configured to set a processor which is processing the content to apply the dynamic adjustment. For example, the gain control settings 408 may allow for the specification of slow, medium, or fast automatic gain control which varies how quickly the dynamic adjustment takes place during processing or presentation.

Dynamic range compression 410 may also be specified in the presentation profile 120. For example, dynamic range compression 410 may be applied to speech to improve intelligibility in some circumstances. In some implementations dynamic range expansion may be applied.

Audio imaging 412 may be specified or supported by the presentation profile 120. The audio imaging 412 may provide spatial information to the user as to the apparent location of a sound with regards to lateral position such as left or right, height, depth or distance, and so forth. The audio imaging 412 may be included in the content 112, or the processing module 122 may be configured to generate or simulate a particular audio image. For example, the source of human voices in the audio output 106 may be processed to present an audio image 412 wherein the voices are perceived by the user 104 as coming from the user's 104 left.

Other 414 settings may be represented in the presentation profiles 120. For example, the presentation profiles 120 may be used to provide particular settings for the display 208 when presenting video content.

The presentation profiles 120 may be provided by the server 110, pre-loaded into the datastore 216 of the user device 102, or be configured by the user 104. For example, the user device 102 may be equipped with an initial set of presentation profiles 120. The user 104 may modify one or more of the presentation profiles 120 or generate entirely new presentation profiles 120. In some implementations these modified or new presentation profiles 120 may be provided to the server 110 or other user devices 102. For example, the user 104 may opt into sharing these presentation profiles 120 and receiving those made by other users 104.

Illustrative Processes

Figure 5:
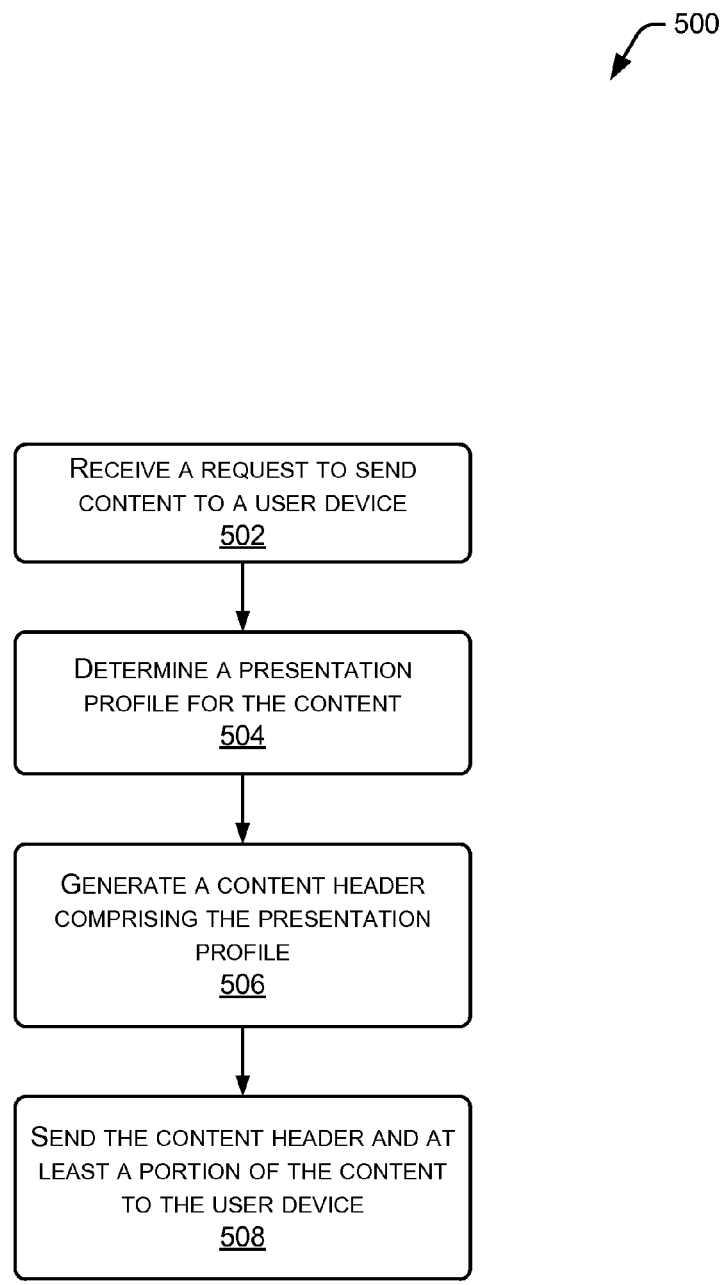
FIG. 5 illustrates a flow diagram of a process of determining a presentation profile associated with content and generating a content header comprising the presentation profile.

FIG. 5 illustrates a flow diagram 500 of a process of determining the presentation profile associated with content and generating a content header comprising the presentation profile. In some implementations this process may be implemented at least in part by the content presentation module 114 operating on the server 110.

Block 502 receives a request to send content 112 to the user device 102. For example, the user 104 may access a user interface on the user device 102 and request a particular audiobook 112(1) for streaming and presentation.

Block 504 determines a presentation profile 120 associated with the content 112. The determination may be based on determination of the one or more of the determination characteristics 218. As described above, the determination characteristics 218 may comprise one or more of content metadata 304 associated with the content or frequency data 306 of the content. Based at least in part on the one or more determination characteristics 218, the presentation profile 120 may be determined. As also described above, the presentation profile 120 may comprise one or more audio equalizer settings 402 configured to affect presentation of the content on the user device 102.

Block 506 generates a content header 302 comprising the presentation profile. For example, the content header 302 may comprise the indicated presentation profile 302(1) or the provided presentation profile 302(2).

Block 508 sends the content header 302 and at least a portion of the content 112 to the user device 102. For example, the content 112 and the content header 302 may be transmitted from the server 110 to the user device 102 via the network 108.

Figure 6:
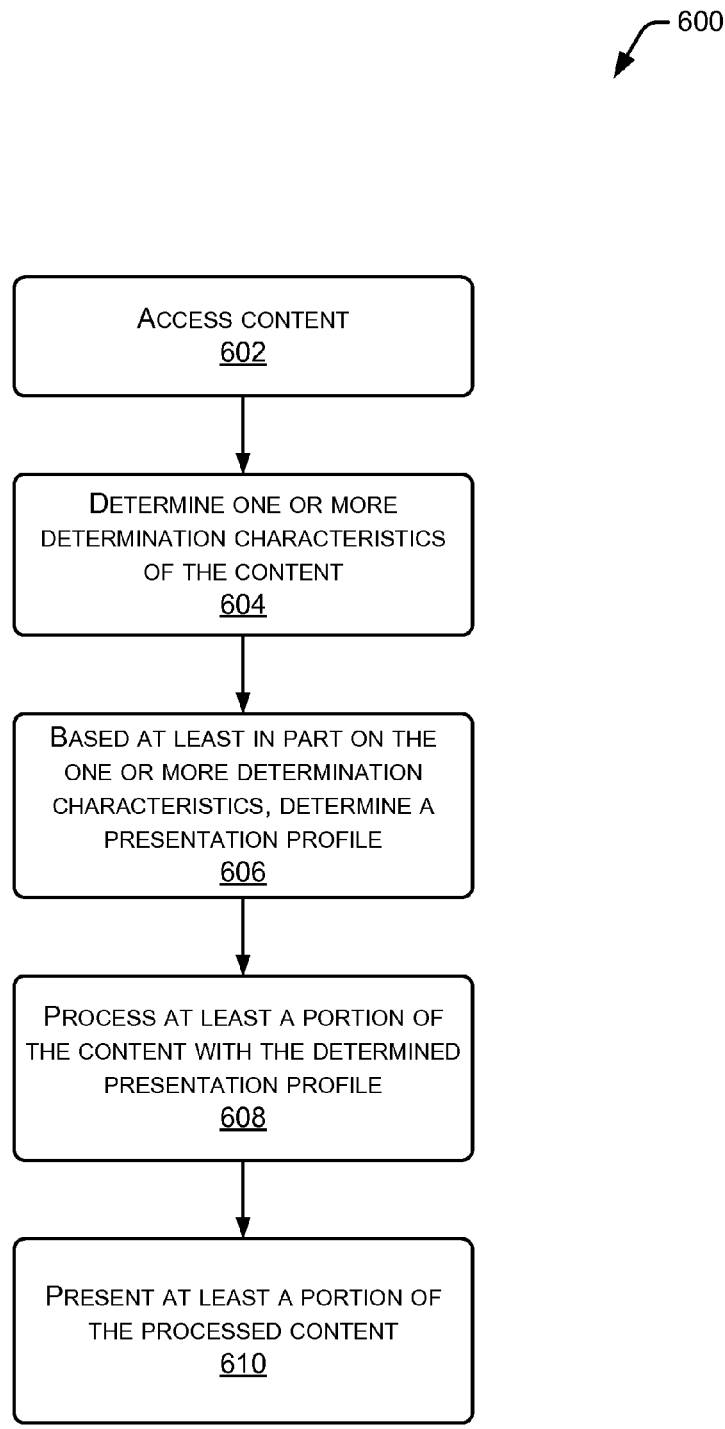
FIG. 6 illustrates a flow diagram of a process of determining a presentation profile and processing content with that presentation profile.

FIG. 6 illustrates a flow diagram 600 of a process of determining the presentation profile 120 and processing content 112 with that presentation profile 120. In some implementations this process may be implemented at least in part by the content presentation module 114 operating on the user device 102, the server 110, or both.

Block 602 accesses content 112 comprising audio data. For example, the content 112 may be retrieved from the datastore 216 or received as a stream from the server 110.

Block 604 determines one or more determination characteristics 218. The determination characteristics 218 may also include the content header 302 designating or including a particular presentation profile 120 associated with the content 112. The content metadata 304 describing a genre associated with the content 112 may also be used.

As described above, frequency data 306 about the audio data may be generated and the determination may be based at least in part on the frequency data 306. In some implementations the determination of the one or more determination characteristics 218 may comprise the user device 102 or the server 110 requesting information from another device. For example, the user device 102 may query the server 110 for the indicated presentation profile 302(1) associated with the content 112.

Block 606, based at least in part on the one or more determination characteristics 218, determines a presentation profile 120 associated with the content. As described above, the presentation profile 120 may comprise one or more of audio equalizer settings 402, speaker configuration 404, amplitude settings 406, or gain control settings 408, and so forth.

Block 608 processes at least a portion of the content 112 with the presentation profile. For example, certain frequency bands of the content 112 may be attenuated while others are amplified in accordance with the audio equalizer settings 402.

Block 610 presents at least a portion of the processed content 112 as the audio output 106. This presentation may use an audio output device such as the speaker 210. As described above, in some implementations presentation profiles 120 may be used to process non-audible content such as video presented on the display 208. For example, the presentation profile 120 may select particular picture settings for the presentation of the video on the display 208.

Figure 7:
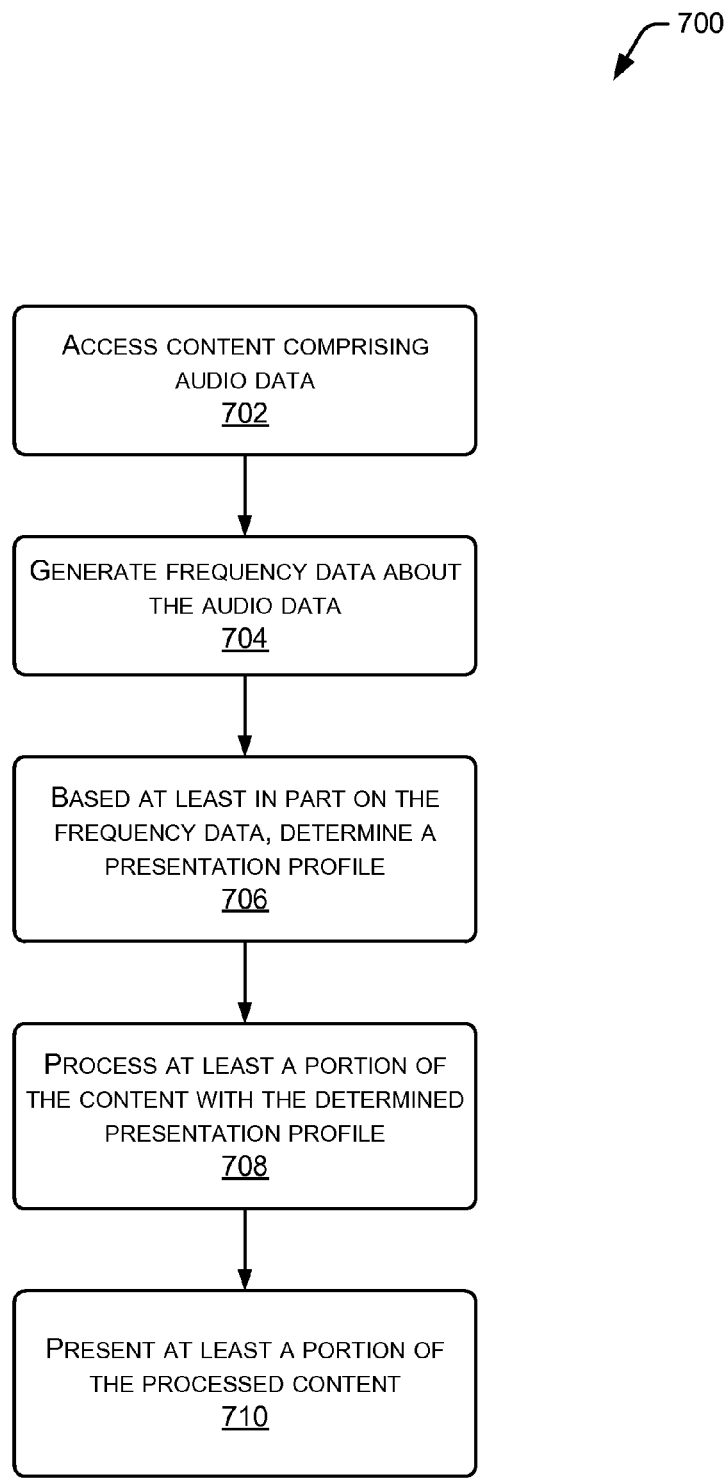
FIG. 7 illustrates a flow diagram of a process of generating frequency data about content and determining the presentation profile based at least in part on this frequency data.

FIG. 7 illustrates a flow diagram 700 of a process of generating the frequency data 306 about the content 112 and determining the presentation profile 120 based at least in part on this frequency data 306. In some implementations this process may be implemented at least in part by the content presentation module 114 operating on the user device 102, the server 110, or both.

Block 702 accesses content 112 comprising audio data. For example, the content 112 may be retrieved from the datastore 216 or received as a stream from the server 110.

Block 704 generates frequency data 306 about the audio data. As described above with regard to FIG. 3, this frequency data 306 may include the highest frequency 306(1), the lowest frequency 306(2), the average frequency 306(3), the beat timing 306(4), and so forth. The frequency data 306 may be determined for a pre-determined time interval of the content 112, or may be continuously generated. For example, the frequency data 306 may be determined based on samples of audio in the first ten seconds of the audio content.

Block 706, based at least in part on the frequency data 306, determines the presentation profile 120 associated with the content 112. In some implementations, the generation of the frequency data 306 and the determination of the presentation profile 120 may be previously determined and provided to the user device 102. For example, upon request to provide content 112 to the user device 102 the server 110 may process content 112 stored thereupon to determine the frequency data 306 and the presentation profile 120. The frequency data, the determined presentation profile 120, and the association with the particular content 112 may be stored for future use by other user devices 102.

Block 708 processes at least a portion of the content 112 with the determined presentation profile 120. For example, the amplitude of the content 112 may be increased in accordance with the amplitude settings 406.

Block 710 presents at least a portion of the processed content 112 as the audio output 106. This presentation may use an audio output device such as the speaker 210.

Figure 8:
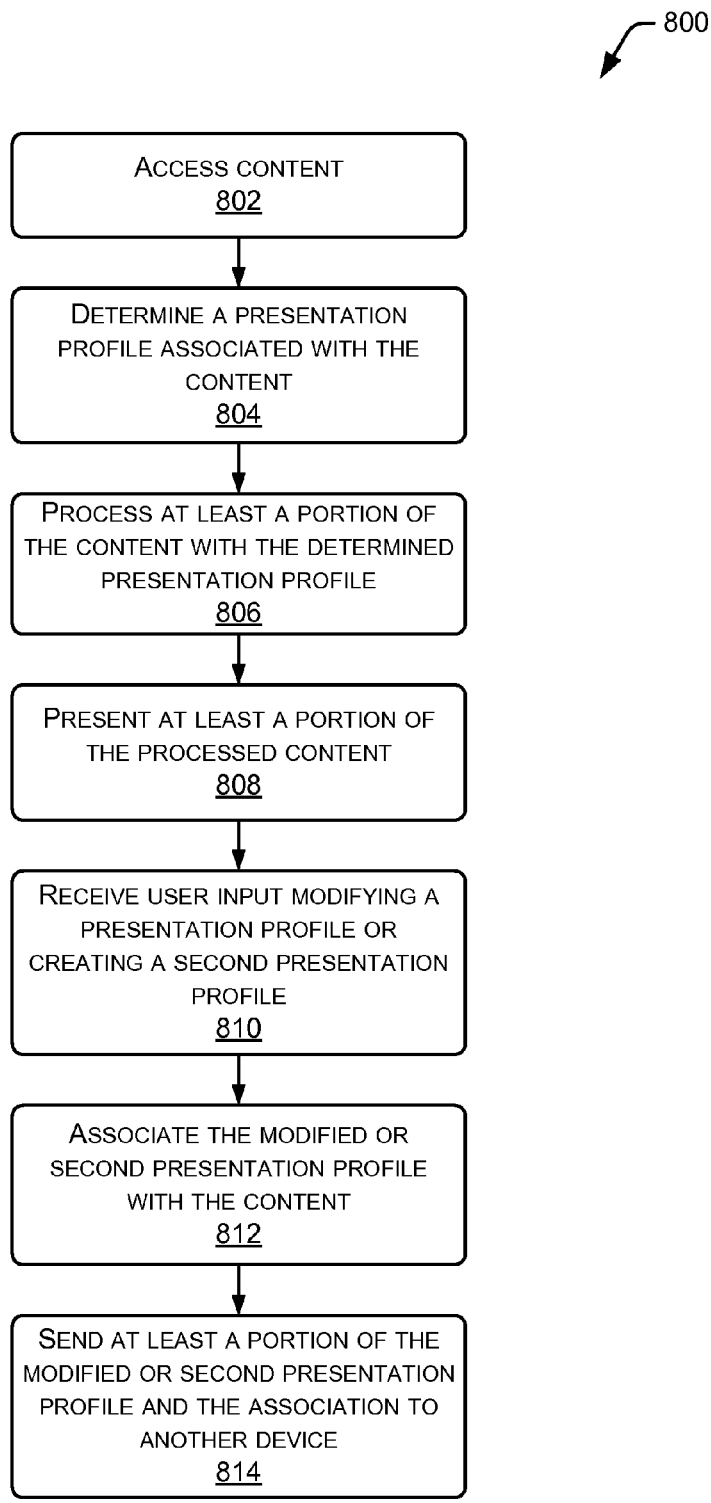
FIG. 8 illustrates a flow diagram of a process of receiving user input and modifying or creating a new presentation profile.

FIG. 8 illustrates a flow diagram 800 of a process of receiving user input and modifying or creating a new presentation profile. In some implementations this process may be implemented at least in part by the content presentation module 114 operating on the user device 102, the server 110, or both.

Block 802 accesses content 112 comprising audio data. For example, the content 112 may be retrieved from the datastore 216 or received as a stream from the server 110.

Block 804 determines the presentation profile 120 associated with the content 112. As described above with regard to FIGS. 5-7, this determination may be based on one or more determination characteristics 218.

Block 806 processes at least a portion of the content 112 with the determined presentation profile 120. For example, the speaker configuration 404 may be adjusted in accordance with the speaker configuration settings 404.

Block 808 presents at least a portion of the processed content 112 as the audio output 106. This presentation may use an audio output device such as the speaker 210.

Block 810 receives user input modifying the presentation profile 120 or creating a second presentation profile 120. For example, the user 104 may prefer to have a particular high frequency band amplified to suit a personal preference and adjust the audio equalizer settings of the graphic equalizer 402(3) accordingly.

This user input may comprise selection of commands in a graphic user interface, spoken commands recognized by the speech recognition module 222, touch gestures, and so forth. For example, the user 102 may speak a command to adjust the graphic equalizer 402(3) during presentation.

In some implementations the content presentation module 114 may present the content using one or more presentation profiles 120, such as in sequence. While stepping through available presentation profiles 120, user input may be accepted to determine a preference for one of the presentation profiles 120 to associate with that piece of content 112.

In some implementations, the presentation of the content 112 as described above with regard to block 808 may be used to calibrate the environment in which the user device 102 is operating. For example, given the known characteristics of the processed content being presented as audio output 106, the known characteristics of the audio output device 106, and audio sampled from a microphone, environmental data may be generated. This environmental data may be used to modify or generate a second presentation profile 120 suited for that particular environment in which the user device 102 is present.

Block 812 associates the modified or second presentation profile 120 with the content 112. Block 814 sends at least a portion of the modified or the second presentation profile 120 and the association to another device. For example, the user device 102 may use the network interface 214 to send this information to the server 110. The server 110 may then provide the modified or second presentation profile 120 and the association to other user devices 102.

Figure 9:
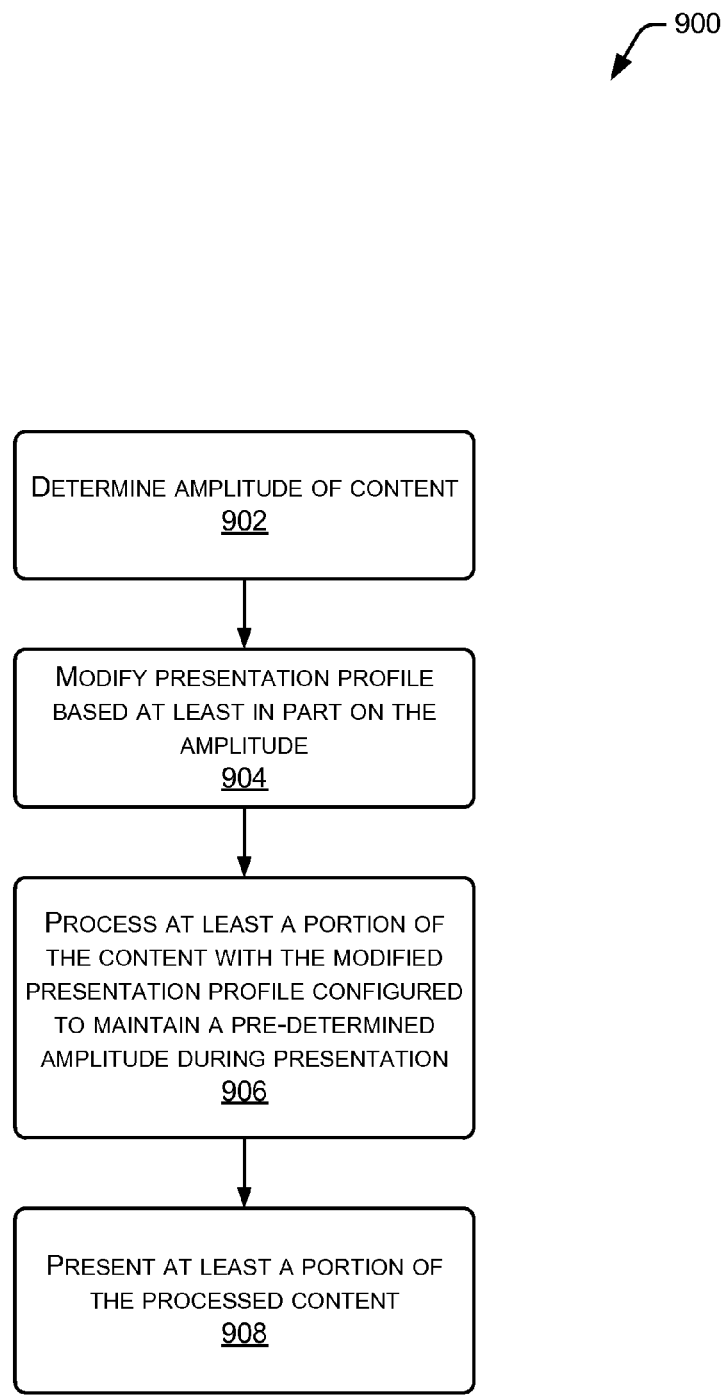
FIG. 9 illustrates a flow diagram of a process of modifying a presentation profile based at least in part on amplitude of content.

FIG. 9 illustrates a flow diagram 900 of a process of modifying a presentation profile 120 based at least in part on amplitude of content. The amplitude or volume level of different pieces of audio content may vary, resulting in a less than seamless user experience. For example, the user 104 may increase the volume level during presentation of the audio output 106 for an audiobook with a soft-spoken reader. That volume level however may be unpleasantly loud when the user switches to listen to rock music. The content presentation module 114 may be configured to adjust the presentation profile 120 to account for these variations. In some implementations this process may be implemented at least in part by the content presentation module 114 operating on the user device 102, the server 110, or both.

Block 902 determines amplitude 308 of at least a portion of the content 112. The amplitude 308 may be determined at particular sample points, averaged over a particular time interval, and so forth. The amplitude 308 may be determined automatically, or may be provided by input from the user 104. For example, the user input may be the user 104 increasing the volume level, which may be used as an indication that the audio level for that piece of content 112 is too low.

Block 904 modifies a presentation profile 120 based at least in part on the amplitude 308. This modification may be configured to maintain a pre-determined amplitude of the content 112 during presentation. For example, where the amplitude 308 is determined to be below a pre-determined amplitude threshold, the amplitude setting 406 may be increased to bring the presented audio output 106 up to the level desired.

The modified presentation profile 120 may be explicitly modified and stored, or may quietly accept the user modification without additional prompting. For example, an explicit modification may provide the user 104 with user interface prompts confirming the changes to the presentation profile 120. The quiet acceptance may store the changes and recall those when the content 112 is next accessed.

Block 906 processes at least a portion of the content 112 with the modified presentation profile 120 configured to maintain a pre-determined amplitude during presentation. Continuing the example, because the amplitude 406 has been increased, the user is able to more easily hear the soft-spoken reader of the audiobook. In comparison, when the user device 102 changes to present a different piece of content 112 such as rock music, the content presentation module 114 may decrease the amplitude setting 406 to avoid presenting audio output 106 which is too loud.

Block 908 presents at least a portion of the processed content. Because of the modification to the presentation profile 120, the amplitude of the audio output 106 has been adjusted without the need for intervention by the user 104.

Figure 10:
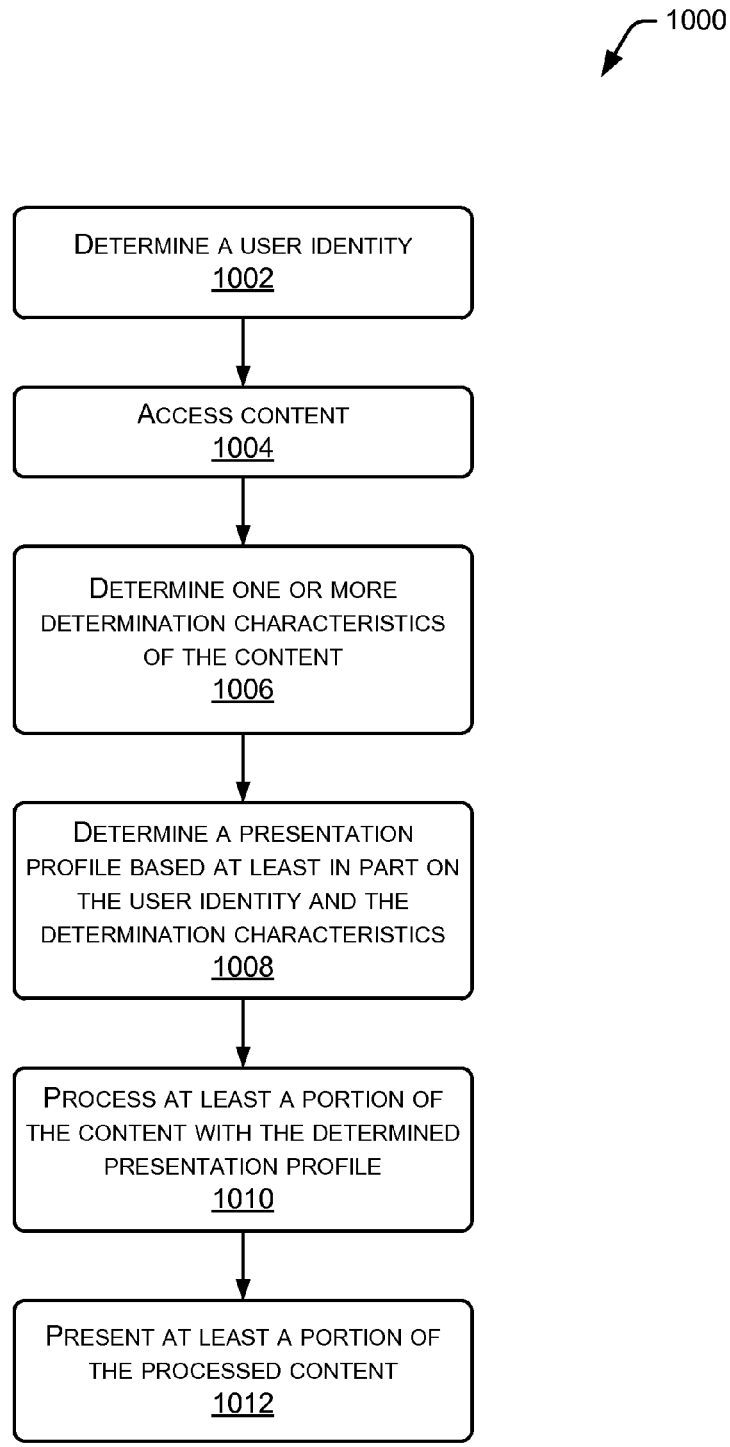
FIG. 10 illustrates a flow diagram of a process of determining the presentation profile based at least in part on a user identity and one or more determination characteristics.

FIG. 10 illustrates a flow diagram 1000 of a process of determining the presentation profile 120 based at least in part on a user identity and one or more determination characteristics 218. Different users 104 may have different preferences. By determining the identity and using this information as part of the determination as to what presentation profile 120 to use, the overall user experience may be improved. In some implementations this process may be implemented at least in part by the content presentation module 114 operating on the user device 102, the server 110, or both.

Block 1002 determines the user's 104 identity. The user 104 may be identified with a password, biometric indicators such as voice, fingerprint, face, and so forth. Other identification methods such as location, physical tokens, and so forth may also be used. The determination of the user's 104 identity may be strict or loose. Strict identity may be a high assurance that the actual identity of the user 104 is known. For example, digital rights management may call for strict identification of a user to maintain controls over the consumption of the content. In comparison, the loose determination may be less accurate, but is considered sufficient for a particular task, such as the determination of the presentation profile 120.

Block 1004 accesses the content 112, as described above. Block 1006 determines one or more determination characteristics 218 of the content. For example, the content metadata 304 may be used to determine the genre 304(1) is "folk music."

Block 1008 determines the presentation profile 120 based at least in part on the user identity and the determination characteristics 218. For example, the user 104(1) may prefer to use the presentation profile for general folk music 120(3) while the user 104(2) may prefer to use the presentation profile for Eastern folk music 120(7).

Block 1010 processes at least a portion of the content 112 with the determined presentation profile 120. For example, the presentation profile 120(7) may be selected for use on the user device 102(2) in use by the user 104(2).

Block 1012 presents at least a portion of the processed content 112 as the audio output 106. This presentation may use an audio output device such as the speaker 210.

Figure 11:
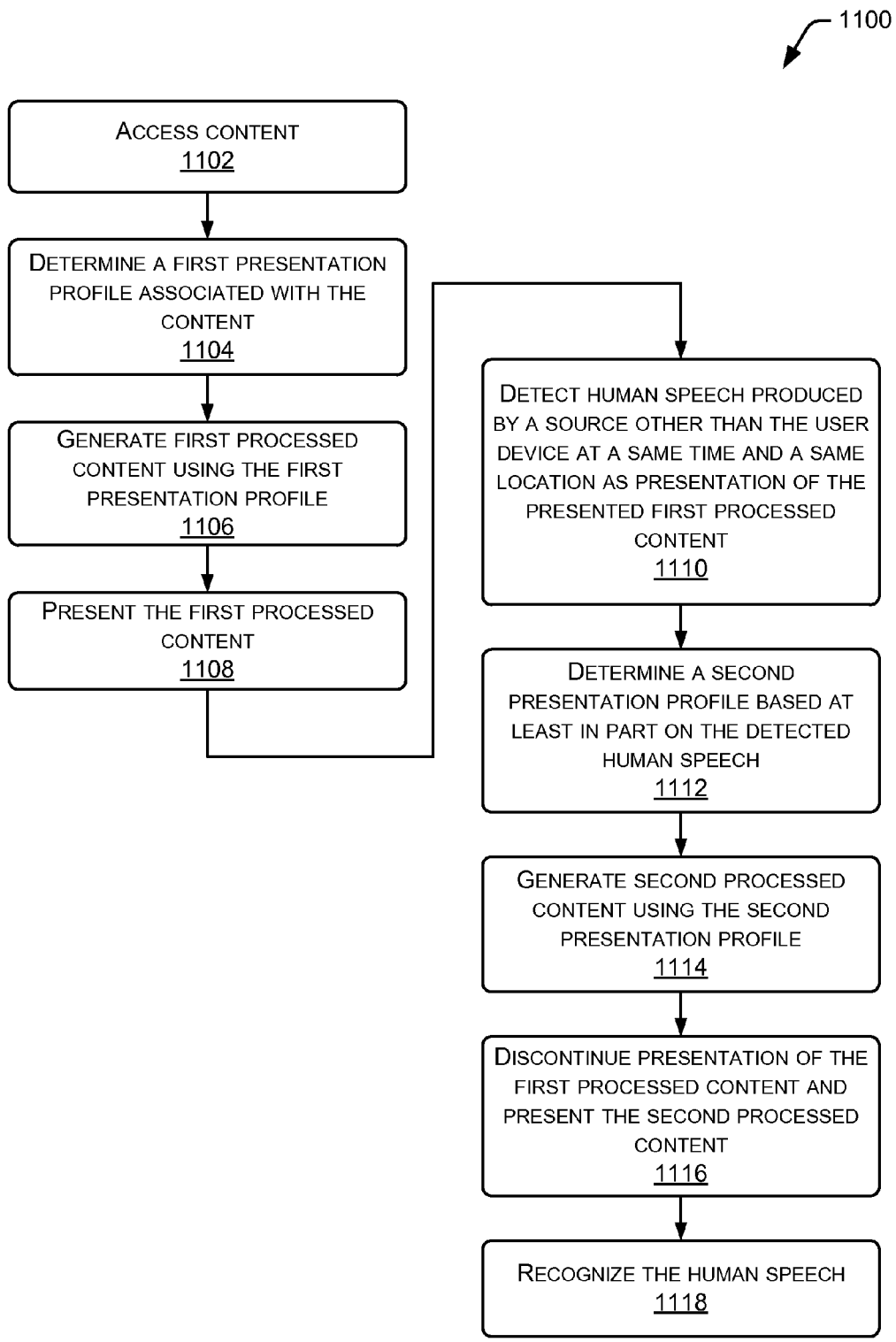
FIG. 11 illustrates a flow diagram of a process of determining a presentation profile based at least in part on presence of human speech contemporaneous with presentation of the content.

FIG. 11 illustrates a flow diagram 1100 of a process of determining a presentation profile 120 based at least in part on presence of human speech contemporaneous with presentation of the content 112 as audio output 106. In some implementations this process may be implemented at least in part by the content presentation module 114 operating on the user device 102, the server 110, or both.

Users 104 may enjoy the content 112 in a variety of settings. For example, the user 104 may be listening to music presented as audio output 106 by the user device 102 while working. While the content 112 is being presented, the user 104 may utter speech, such as when talking to a co-worker, speaking on the phone, or providing voice input to a device. The presentation of the content 112 as the audio output 106 may interfere with the audible communication taking place, reducing the intelligibility of the speech to other users 104, the speech recognition module 222, and so forth. The content presentation module 114 may be configured to modify or select a different presentation profile 120 configured to improve audible communication during presentation of the content 112.

Block 1102 accesses content 112 comprising audio data. For example, the content 112 may be retrieved from the datastore 216 or received as a stream from the server 110.

Block 1104 determines a first presentation profile 120 associated with the content 112. As described above with regard to FIGS. 5-10, this determination may be based on one or more determination characteristics 218, user identity, and so forth.

Block 1106 generates first processed content using the determined first presentation profile 120. For example, the graphic equalizer settings 402(3) may amplify mid-range sounds.

Block 1108 presents at least a portion of the first processed content 112 as the audio output 106. This presentation may use an audio output device such as the speaker 210. As described earlier, the user 104 may be speaking, or other speech such as replayed audio may be present in the operating environment of the user device 102.

Block 1110 detects human speech produced by a source other than the user device 102 at a same time and same location as presentation of the presented first processed content. In one implementation, a microphone coupled to the I/O interface 206 may be used to acquire audio signals which are processed for human speech. In another implementation, data may be manually input such as the user 104 entering a command that speech is taking place. In yet another implementation, data from other devices or sensors may be acquired to determine or detect speech is present in the environment of the user device 102, or is likely to be taking place. For example, data indicating when a telephone is off-hook may be used as an indication that speech is taking place. In another example, data indicating that two users are standing near one another may indicate that speech is taking place.

The determination or detection of speech may be done at pre-determined intervals, upon particular events, or continuously. For example, a microphone may be used to continuously monitor for speech in the environment of the user device 102.

Block 1112 determines a second presentation profile based at least in part on the determined presence of human speech. In some implementations this determination may also be based at least in part on one or more of the determination characteristics 218, the user identity, and so forth.

In one implementation, the second presentation profile may be a modification of the first presentation profile. For example, where the speech recognition module 222 is in use to accept dictation from the user 104, the frequencies of particular utility to the speech recognition module 222 may be attenuated in the content 112. This attenuation may then improve the signal-to-noise ratio of the acquired audio input of the user 104 speaking during presentation of the content 112.

In another implementation, the second presentation profile may include a speaker configuration 404 which minimizes the volume or discontinues use of a speaker closest to the user 104 speaking, the microphone acquiring data, or both. This may improve acquisition of the speech.

Block 1114 generates second processed content using the second presentation profile. Block 1116 discontinues presentation of the first processed content and presents the second processed content. Stated another way, the audio output 106 is transitioned from being processed with the first presentation profile to the second.

Where speech recognition is called for, block 1118 recognizes the human speech. As described above, because the audio output 106 has now been tailored to improve the acquisition, intelligibility, or both of the speech, the user experience is improved.

The above is described in the context of monitoring the environment in which the user device 102 is being used. In some implementations the user device 102 may be distributed across one or more physical locations. For example, the processor 202 and the memory 204 of the user device 102 may be located in one room while the display 208 and the speaker(s) 210 may be located in another. In yet another implementation, the user device 102 may comprise a simplified client device configured to access the functions described in this disclosure which are executed on the server 110.

CONCLUSION

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Certain aspects of the disclosure are described above with reference to block and flow diagrams of systems, methods, apparatus, and/or computer program products according to various implementations. It will be understood that one or more blocks of the block diagrams and flow diagrams, and combinations of blocks in the block diagrams and the flow diagrams, respectively, can be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that can direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A device, comprising:
  at least one memory storing computer-executable instructions;
  at least one processor configured to access the at least one memory and execute the computer-executable instructions to:
    receive a request to send content to a user device;
    determine a first presentation profile associated with the content, wherein the first presentation profile comprises one or more audio equalizer settings configured for use by the user device to affect presentation of the content on the user device;
    generate a content header associated with the content, the content header comprising the first presentation profile;
    send the content header and at least a portion of the content to the user device;
    receiving detected human speech from the user device and produced by a source other than the user device at a location and a time of the presentation of the content by the user device;
    determine a second presentation profile based at least in part on the detection of the human speech;
    generate a second content header comprising the second presentation profile; and
    send the second content header to the user device.

2. The device of claim 1, the determination of the first presentation profile comprising instructions to:
  determine one or more presentation profile determination characteristics descriptive of the content and comprising one or more of:
    content metadata associated with the content,
    frequency data of the content,
    or amplitude data of the content; and
    based at least in part on the one or more presentation profile determination characteristics, determine the first presentation profile.

3. The device of claim 1, wherein the one or more audio equalizer settings of the second presentation profile configure the user device to attenuate one or more audio frequencies of the content corresponding to those used for machine-based speech recognition.

4. The device of claim 1, wherein the first presentation profile further comprises one or more of:
  amplitude settings configured to set the at least one processor during processing to attenuate or amplify audio during presentation of the content,
  gain control settings configured to set the at least one processor during processing to use feedback from the content to adjust amplification during presentation of the content, or
  speaker configuration information configured to set an audio output device to use a particular set of one or more speakers during presentation of the content.

5. The device of claim 1, wherein the second presentation profile comprises data configured to set the at least one processor to attenuate one or more audio frequencies of the audio content corresponding to those used for machine-based speech recognition during presentation of the content.

6. The device of claim 1, wherein the second presentation profile comprises data configured to set the at least one processor to decrease overall amplitude of the audio content during presentation of the content.

7. The device of claim 1, wherein the second presentation profile comprises data configured to set the at least one processor to selectively reduce amplitude at one or more particular speakers of the user device during presentation of the content.

8. A device, comprising:
  at least one memory storing computer-executable instructions;
  at least one processor configured to access the at least one memory and execute the computer-executable instructions to:
    access content comprising audio data;
    access a content header associated with the content, the content header designating a first presentation profile;
    determine the first presentation profile associated with the content from the content header, wherein the first presentation profile comprises one or more audio equalizer settings configured for use by the user device to affect presentation of the content on the device;

detect human speech produced by a source other than the device at a location and at a time of the presentation of the content by the device;

access a second content header associated with the content, the content header designating a second presentation profile, the second presentation profile based at least in part on the detection of the human speech.

9. The device of claim 8, further comprising an audio output device coupled to the at least one processor, and the instructions further configured to present at least a portion of the content using the audio output device.

10. The device of claim 8, further comprising a user input device coupled to the at least one processor, and further comprising instructions to:

receive user input from the user input device;

based at least in part on the user input, modify the first presentation profile or create a third presentation profile, in the at least one memory; and associate the modified or third presentation profile with the content in the at least one memory.

11. The device of claim 8, wherein the first presentation profile further comprises one or more of:

amplitude settings configured to set the at least one processor during processing to attenuate or amplify audio during presentation of the content, gain control settings configured to set the at least one processor during processing to use feedback from the content to adjust amplification during presentation of the content, or speaker configuration information configured to set an audio output device to use a particular set of one or more speakers during presentation of the content.

12. A non-transitory computer-readable medium storing computer-executable instructions that, when executed by a processor, configure the at least one process to perform operations, comprising:

receive a request to send content to a user device;

determine a first presentation profile associated with the content, wherein the first presentation profile comprises one or more audio equalizer settings configured for use by the user device to affect presentation of the content on the user device;

generate a content header associated with the content, the content header comprising the first presentation profile;

send the content header and at least a portion of the content to the user device;

receive detected human speech from the user device and produced by a source other than the user device at a location and at a time of the presentation of the content by the user device;

determine a second presentation profile based at least in part on the detection of the human speech;

generate a second content header comprising the second presentation profile; and send the second content header to the user device.

* * * * *